United States Patent
Fisher et al.

(10) Patent No.: US 12,032,008 B2
(45) Date of Patent: Jul. 9, 2024

(54) SYSTEM FOR CONTACTLESS TESTING OF RADIO FREQUENCY APERTURES

(71) Applicant: Raytheon Company, Waltham, MA (US)

(72) Inventors: Christopher J. Fisher, Allen, TX (US); Amanda Couch, Plano, TX (US); John Sherrill, Rockwall, TX (US); Justin Kasemodel, McKinney, TX (US); Justin Stroup, Anna, TX (US); Allen Kelly, Dallas, TX (US)

(73) Assignee: Raytheon Company, Tewksbury, MA (US)

( * ) Notice: Subject to any disclaimer, the term of this patent is extended or adjusted under 35 U.S.C. 154(b) by 708 days.

(21) Appl. No.: 17/175,512

(22) Filed: Feb. 12, 2021

(65) Prior Publication Data

US 2022/0260623 A1    Aug. 18, 2022

(51) Int. Cl.
*G01R 29/08* (2006.01)
*H01Q 13/02* (2006.01)

(52) U.S. Cl.
CPC ......... *G01R 29/0878* (2013.01); *H01Q 13/02* (2013.01); *Y10T 29/5313* (2015.01)

(58) Field of Classification Search
CPC ................ G01R 29/0878; G01R 31/00; G01R 29/0871; H01Q 13/02; Y10T 29/5313
USPC .......................................... 29/729, 593, 705
See application file for complete search history.

(56) References Cited

U.S. PATENT DOCUMENTS

| | | | |
|---|---|---|---|
| 4,832,246 A | 5/1989 | Ono et al. | |
| 6,563,087 B1 | 5/2003 | Yokoyama et al. | |
| 7,602,333 B2 * | 10/2009 | Hiramatsu | H01Q 13/24 342/134 |
| 10,879,608 B2 * | 12/2020 | Salazar-Cerreno | G01R 29/0821 |

OTHER PUBLICATIONS

NSI-MI, 8-Axis Robotic Antenna Measurement System, https://www.nsi-mi.com/products/syetm-solutions/near-filed-systems/combination-system/8-axis-robotic-antenna-measurement-system, to the best of applicant's knowledge article was available before the application filing date, 5 pages, NSI-MI Technologies, Suwanee, GA.

* cited by examiner

*Primary Examiner* — Thiem D Phan (57) ABSTRACT

A system for contactless testing of radio frequency apertures is provided. The system comprises a fixture having a fixture mount operable to be received in a fixture receiver of a robotic system, and a vector network analyzer ("VNA") supported by the fixture. A radiating antenna is supported by the fixture, and is operable to be connected to the VNA via a cable. Upon movement of the fixture via the robotic system, the VNA, the radiating antenna, and the cable maintain a static positional relationship relative to one another.

20 Claims, 5 Drawing Sheets

SYSTEM FOR CONTACTLESS TESTING OF RADIO FREQUENCY APERTURES

BACKGROUND

Radio Frequency ("RF") waves are widely used in many aspects of terrestrial and space based science (earth observation to space astronomy) and also have obvious application in the radar and communication industry. The next generation of large bandwidth, high performance apertures require a high yield of individual elements to achieve the desired RF aperture performance. Accordingly, there is a need to increase efficiency in production of RF apertures while simultaneously ensuring functionality of the same.

BRIEF DESCRIPTION OF THE DRAWINGS

Features and advantages of the disclosed technology will be apparent from the detailed description which follows, taken in conjunction with the accompanying drawings, which together illustrate, by way of example, features of the disclosed technology; and, wherein.

Reference will now be made to the exemplary embodiments illustrated, and specific language will be used herein to describe the same. It will nevertheless be understood that no limitation of the scope of the exemplary embodiments is thereby intended.

DETAILED DESCRIPTION

An initial overview of the inventive concepts are provided below and then specific examples are described in further detail later. This initial summary is intended to aid readers in understanding the examples more quickly, but is not intended to identify key features or essential features of the examples, nor is it intended to limit the scope of the claimed subject matter.

The present disclosure sets forth a system and method for integrated testing and manufacturing of radio frequency apertures. The present disclosure further sets forth components that can be utilized in such a system. In one example, a contactless probe for contactless testing of radio frequency apertures is provided. The contactless probe can comprise a fixture comprising a fixture mount operable to be received in a fixture receiver of a robotic system, and a vector network analyzer ("VNA") supported by the fixture. The contactless probe can further comprise a radiating antenna supported by the fixture, the radiating antenna is operable to be connected to the VNA via a cable. Upon movement of the fixture via the robotic system, the VNA, the radiating antenna, and the cable maintain a static positional relationship relative to one another.

In one example, the fixture comprises a housing and the fixture mount is disposed on a top side of the housing. The VNA is can be disposed at least partially within the housing. The housing can have an open side, and the cable connected to the radiating antenna and the VNA can be connected to the VNA at the open side. The radiating antenna can be disposed on a lower side of the housing. The radiating antenna can be a horn antenna.

In another example, a system is provided for integrated manufacturing and testing of radio frequency apertures. The system can comprise a robotic arm comprising a fixture receiver supported at a distal end of the robotic arm. The system also can comprise a contact probe comprising a first fixture mount configured to be received by the fixture receiver of the robotic arm. The contact probe can be operable to contact test traces of one or more printed wire boards.

The system can further comprise a soldering tip comprising a second fixture mount configured to be received by the fixture receiver of the robotic arm, the soldering tip can be operable to join the printed wire boards and other components of the radio frequency apertures. The system can further comprise a contactless probe comprising a third fixture mount configured to be received by the fixture receiver of the robotic arm. The contactless probe can also comprise a network analyzer and a radiating antenna. The contactless probe can be operable to validate functionality of the radio frequency apertures.

In one example, the robotic arm can comprise a six-axis robotic arm. The contactless probe can comprise a housing supporting the third fixture mount, the network analyzer, and the radiating antenna. The housing can comprise a top frame, a bottom frame, and side frames connecting the top frame to the bottom frame to define an internal compartment. The network analyzer can be disposed at least partially within the internal compartment.

In some examples, the third fixture mount can be disposed on the top frame and the radiating antenna can be supported by the bottom frame. The housing can comprise an open side and the network analyzer can comprise one or more cable connection points that are disposed at the open side. The system can comprise one or more cables connecting the network analyzer from the connection points to the radiating antenna. Upon movement of the contactless probe via the robotic arm, the network analyzer, the radiating antenna, and the cables can maintain a static positional relationship relative to one another.

In another example, a method for integrated testing and manufacturing radio frequency apertures is provided. The method can comprise operating a contact probe with a robotic arm to evaluate the functionality of traces on a printed wire board, operating a soldering tip with the robotic arm to solder the printed wire board to one or more other components to form a radio frequency apertures assembly, and operating a contactless probe with the robotic arm to evaluate functionality of the radio frequency apertures using the contactless probe.

In some examples, operating the contactless probe can comprise moving a vector network analyzer and a radiating antenna supported by a housing attached to the robotic arm. The vector network analyzer and the radiating antenna can move while maintaining a static positional relationship. The method can further comprising removing the contact probe from the robotic arm after operating the contact probe and attaching the soldering tip to the robotic arm, and removing the soldering tip from the robotic arm after operating the soldering tip and attaching the contactless probe to the robotic arm.

Figure 1:
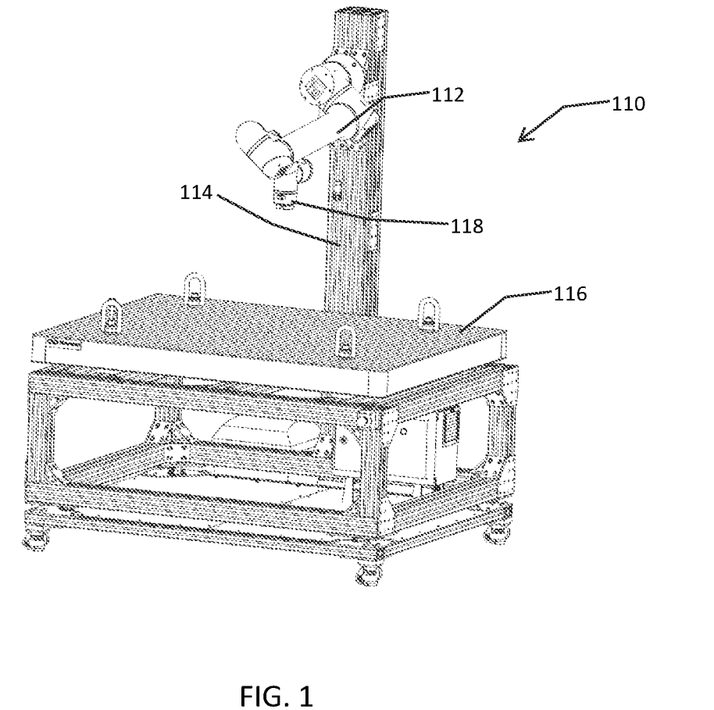
FIG. 1 is an isometric view of an exemplary workstation including a robotic arm that forms part of a system for integrated testing and manufacturing radio frequency apertures.

To further describe the present technology, examples are now provided with reference to the figures. The present disclosure sets forth a system for integrated testing and manufacturing of radio frequency apertures. The system can comprise a workstation. With reference to FIG. 1, shown is a workstation 110 that facilitates integration of the testing and manufacturing of radio frequency apertures in accordance with an example of the present disclosure. Advantageously, the workstation 110 provides a single station that performs multiple testing and manufacturing processes quickly and efficiently in an integrated manner as discussed herein. An integrated system, method, or process as used herein refers to different products, features, and/or processes using such products and features that can be performed at a single workstation. Thus, an integrated system, method, or process allows different products, features, and/or processes that previously were used and/or performed at different and distinct locations using separate tools and workstations to be performed at a single workstation. As will be described below, the workstation 110 facilitates integration of testing and manufacturing processes that are all completed at the workstation 110 where such testing and manufacturing processes previously were completed using separate tooling and workstations. Although the workstation 110 is described in detail, it is noted that those skilled in the art will recognize that the workstation 110 can comprise a variety of different sizes and configurations. As such, the specific workstation 110 described here and shown in the drawings is not intended to be limiting in any way.

The workstation 110 comprises a robotic arm 112. In one example, the robotic arm 112 can be a six-axis robotic arm. Accordingly, the robotic arm 112 can facilitate movement in six degrees of freedom. Other types of robotic arms are contemplated for use. The robotic arm 112 can be attached to a column 114 supported by a work surface 116, in this case by a side of the work surface 116. The work surface 116 can be a frame, a table, or any other suitable structure that is capable of supporting the robotic arm 112, as well as a workpiece that is to be manufactured, manipulated by and/or tested by one or more tools or fixtures mounted to the robotic arm 112. To this end, the robotic arm 112 comprises a fixture receiver 118 at a distal end thereof to which a variety of tools or fixtures can be mounted. In one example, the fixture receiver 118 can comprise a quick connect type mount to allow quick changeover from one tool or fixture to another tool or fixture.

Among different steps to manufacture radio frequency apertures includes testing of individual radio frequency aperture components, joining together of the various radio frequency aperture components, and testing the assembled radio frequency apertures. The workstation 110 advantageously allows each of these steps to be completed at the workstation 110 with the robotic arm 112.

Figure 2:
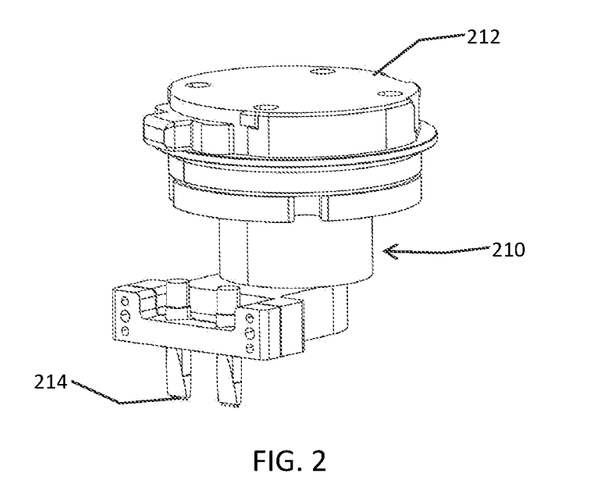
FIG. 2 is an isometric view of an exemplary touch probe of the system for integrated testing and manufacturing radio frequency apertures that is used with the workstation shown in FIG. 1.

The system further comprises a touch probe. With reference to FIGS. 1 and 2, shown is a touch probe 210 to be used at the workstation 110 with the robotic arm 112 in accordance with an example of the present disclosure. The touch probe 210 comprises a fixture mount 212 to selectively attach the touch probe 210 to and detach the touch probe 210 from the fixture receiver 118 of the robotic arm 112. In one example, which is not intended to be limiting in any way, the fixture mount 212 can be configured as a quick-release type of fixture mount to facilitate quick attachment to and detachment from the fixture receiver 118. The touch probe 210 can further comprise a contact probe 214. The contact probe 214 can be configured to touch down onto one or more parts to be tested. In the present example, radio frequency apertures can be formed using printed wire boards comprising traces. The touch probe 210 can be operated such that the contact probe 214 touches down on the traces of the printed wire board to confirm connectivity or functionality of each trace. With the touch probe 210 being manipulated by the robotic arm 112 where the robotic arm 112 is a six-axis robotic arm, the touch probe 210 can be used to test components having various three-dimensional profiles. The touch probe 210 shown in FIG. 2 is provided only by way of example and any suitable touch probe can be utilized without limitation.

Figure 3:
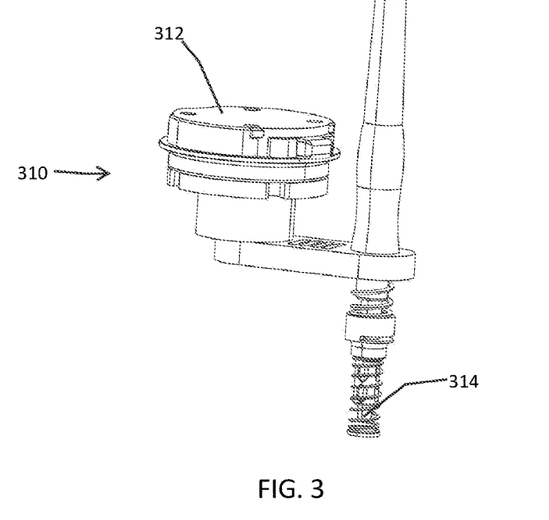
FIG. 3 is an isometric view of an exemplary soldering tip of the system for integrated testing and manufacturing radio frequency apertures that is used with the workstation shown in FIG. 1.

The system further comprises a soldering device. With reference to FIGS. 1 and 3, shown is a soldering device 310 in accordance with an example of the present disclosure. Similar to the touch probe 210 described above and shown in FIG. 2, the soldering device 310 comprises a fixture mount 312. The fixture mount 312 is operable to selectively attach the soldering device 310 to and detach the soldering device 310 from the fixture receiver 118 of the robotic device 112. Advantageously, the fixture mount 312 can be configured to facilitate quick attachment to and detachment from the fixture receiver 118. In this manner, different operations performed at the workstation 110 can be performed quickly and efficiently. Among other features, the soldering device 310 comprises a soldering tip 314. The soldering tip 314 is operable to join components of radio frequency apertures together via soldering. For example, the soldering tip 314 can join one or more components to a printed wire board on the workstation 110 that was previously tested via the touch probe 210 (see FIG. 2). This can be done without having to remove the printed wire board from the workstation 110. With the soldering tip 314 being manipulated by the robotic arm 112 where the robotic arm 112 is a six-axis robotic arm, the soldering tip 314 can be used to join components having various three-dimensional profiles. The soldering device 310 shown in FIG. 3 is provided only by way of example and any suitable soldering device can be utilized without limitation.

The system further comprises a contactless probe. With reference to FIG. 1 and FIGS. 4-6, shown is an exemplary contactless probe fixture 410 in accordance with an example of the present disclosure. The contactless probe fixture 410 facilitates contactless probing or testing at the workstation 110 by providing a platform operable to support and position electronics and other components in close proximity to one another (i.e., on the same platform), particularly those that are required to be connected to one another that are otherwise supported about different structures and in different positions relative to one another. As will be described below, the contactless probe fixture 410 is operable to facilitate contactless probing or testing of components in three-dimensions while providing low radio frequency signal losses and allowing for high-dynamic range in probing or testing.

Figure 4:
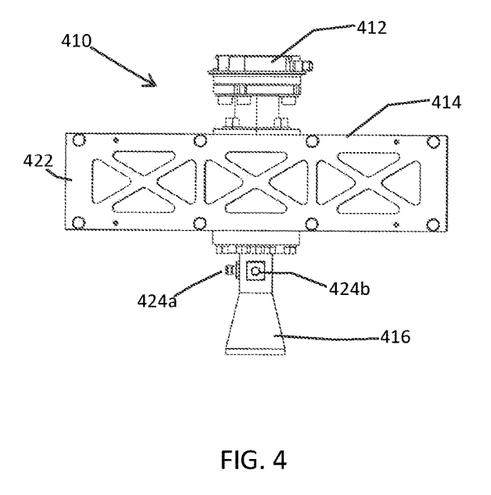
FIG. 4 is side view of an exemplary contactless probe fixture of the system for integrated testing and manufacturing radio frequency apertures that is used with the workstation shown in FIG. 1.
Figure 5:
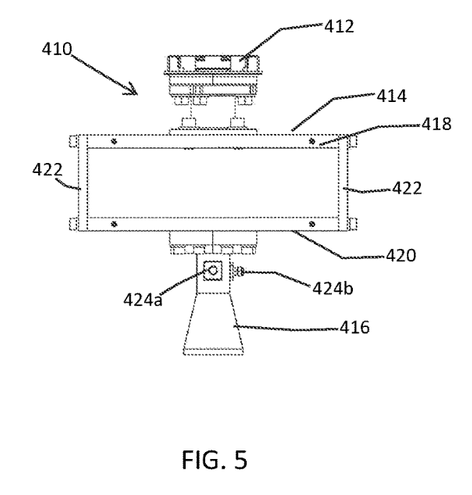
FIG. 5 is a front view of the contactless probe fixture shown in FIG. 4.
Figure 6:
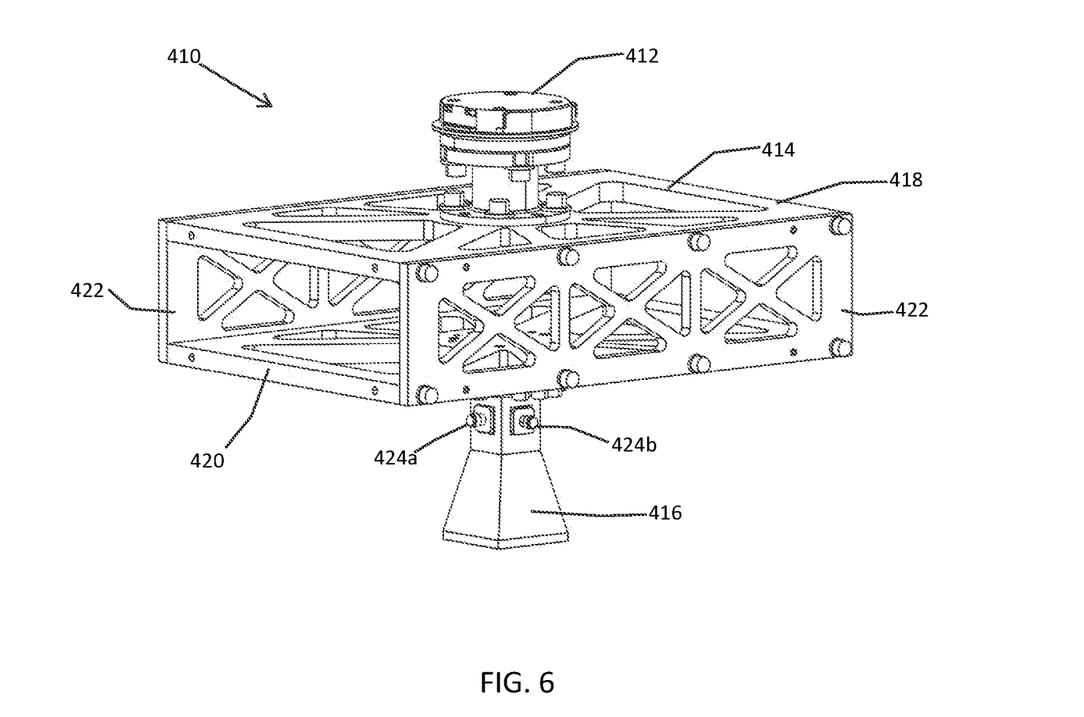
FIG. 6 is an isometric view of the contactless probe fixture shown in FIG. 4.

The contactless probe fixture 410 comprises a fixture mount 412 similar to fixture mounts 212 and 312. The fixture mount 412 is operable to selectively attach the contactless probe fixture 410 to and detach the contactless probe 410 from the fixture receiver 118 of the robotic arm 112. As with the others, and in accordance with one example, the fixture mount 412 can be configured to facilitate quick attachment to and detachment from the fixture receiver 118. In this manner, different operations performed at the workstation 110 can be performed quickly and efficiently.

The contactless probe fixture 410 further comprises a housing 414. The housing 414 can be configured as a frame-like structure comprising a top frame or frame component 418, a bottom frame or frame component 420, and side frames or frame components 422. The top frame 418, bottom frame 420, and side frames 422 are configured to define an interior of the housing 414. The side frames 422 are provided on opposite edges of the top and bottom frames 418, 420. In this example, the housing 414 comprises two side frames 422. Accordingly, edges of the side frames 422 and top and bottom frames 418, 420 define open sides of the housing 414 through which the interior can be accessed, such as for disposing one or more electronics components within the interior of the housing 414 to be supported by the housing 414 of the contactless probe fixture 410. The housing 414 can comprise additional frames, such as to provide closed sides (e.g., with some being removably connected to each other, or some being openable (e.g., via a hinge), or some comprising one or more access openings formed therein). Moreover, the housing 414 can be configured and sized as needed or desired to accommodate whatever components are to be supported in or by the housing.

The system further comprises a radiating antenna 416, which can be supported by and extend from the bottom frame 420 of the housing 414 of the contactless probe fixture 410 opposite the fixture mount 412, which is supported on an upper or top side of the housing 414. The radiating antenna 416 is operable to radiate and to detect signals such as radio frequencies during a probing or testing operation. The radiating antenna 416 comprises a first connector 424a and a second connector 424b. The first and second connectors 424a, 424b are operable to connect the radiating antenna 416 to a network analyzer. As shown, in one example, the radiating antenna 416 can comprise a horn type antenna.

Figure 7:
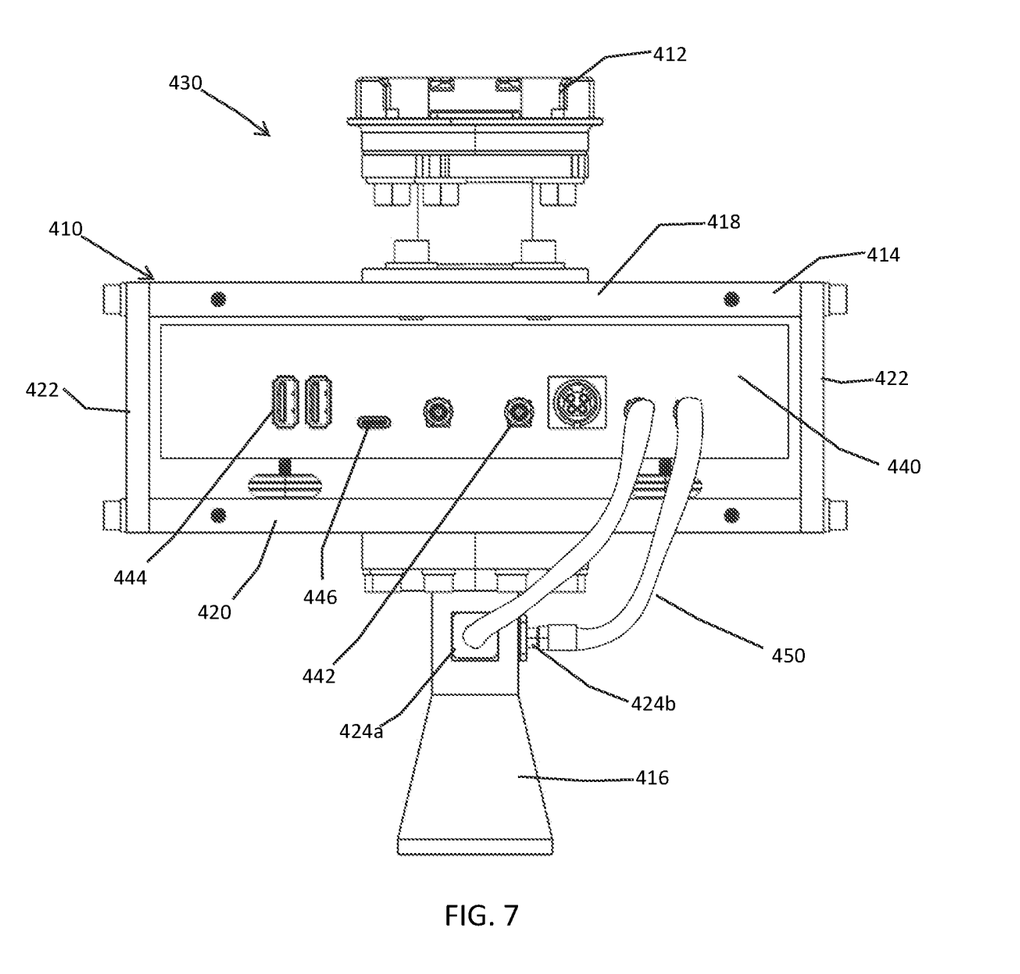
FIG. 7 is a front view of the contactless probe fixture shown in FIG. 4 in support of a vector network analyzer.
Figure 8:
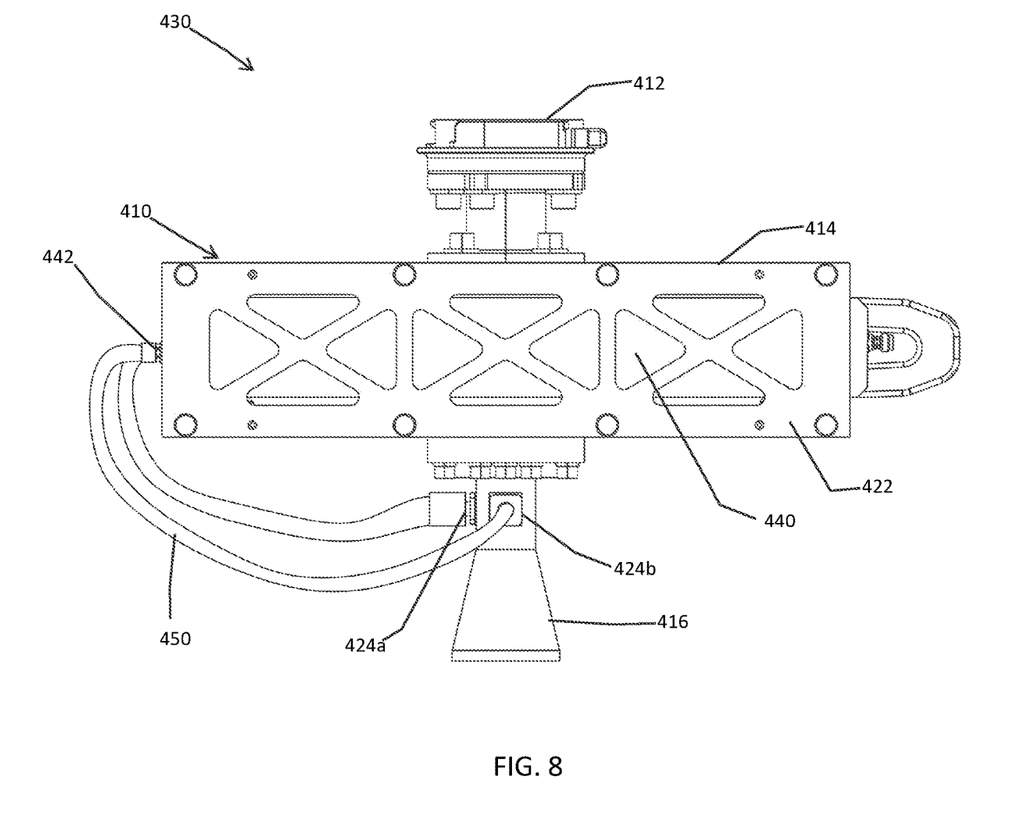
FIG. 8 is a side view of the contactless probe and shown in FIG. 7.

To this end, the system further comprises a contactless probe comprising the contactless probe fixture 410, a radiating antenna, and a network analyzer. With reference to FIG. 1 and FIGS. 7 and 8, shown is a contactless probe 430 comprising the contactless probe fixture 410, a network analyzer 440 operably supported therein in accordance with an example of the present disclosure, and the radiating antenna 416. In one example, the network analyzer 440 can comprise a vector network analyzer (VNA). The network analyzer 440 can be configured to generate signals to be emitted by the radiating antenna 416 and to detect reflected signals captured by the radiating antenna 416. The network analyzer 440 can be any suitable network analyzer now known or later developed without limitation. Advantageously, the housing 414 of the contactless probe fixture 410 can be sized and configured to at least partially house the network analyzer 440. Thus, the network analyzer 440 is supported by the contactless probe fixture 410 at least partially within the interior of the housing 414.

The network analyzer 440 can comprise one or more ports such as a plurality of radio frequency connectors 442. The radio frequency connectors 442 can connect to the first and second connectors 424a, 424b of the radiating antenna 416 via cables 450 to connect the network analyzer 440 to the radiating antenna 416. The network analyzer 440 can comprise other ports for power and/or data transfer such as USB ports 440, USB-C port 446, and the like. The ports including the radio frequency connectors 442, USB ports 440, USB-C port 446, and the like can be accessible through an open side of the housing 414, or through various openings formed in the frames or frame components. Thus, the cables 450 can extend from the open side of the housing 414 to the radiating antenna 416, and can therefore also be supported on the same platform provided by the contactless probe fixture 410.

With the network analyzer 440 and the radiating antenna 416 being supported by the housing 414, these components are in close proximity to one another, each being supported about the same platform, namely the contactless probe fixture 410. Advantageously, each of the contactless probe fixture 410, the radiating antenna 416, and the network analyzer 440 making up the contactless probe 430 can be moved and manipulated simultaneously by the robotic arm 112 of the workstation 110 when the contactless probe 430 is connected to the robotic arm 112 via the fixture mount 412. Locating the network analyzer 440, the radiating antenna 416 and the cables 450 on the same platform allows the cables 450 to be relatively short, such as having a length of only four to ten inches, for example. The relatively short length of the cables 450 minimizes the signal loss between the radiating antenna 416 and the network analyzer as compared to prior systems where these are not in close proximity to one another, thus requiring much longer connecting cables. Further, because the network analyzer 440 and the radiating antenna 416 are supported by the contactless probe fixture 410, the network analyzer 440, the radiating antenna 416, and the cables 450 move together as the contactless probe 430 is moved by the robotic arm 112. That is, the network analyzer 440, the radiating antenna 416, and the cables 450 maintain a static positional relationship relative to one another while the contactless probe 430 is moved in various degrees of freedom by the robotic arm 112. This further decreases potential signal loss in the cables 450 between the radiating antenna 416 and the network analyzer 440, allowing for high dynamic range in testing and probing.

The contactless probe 430 is operable to test manufactured radio frequency apertures. The contactless probe 430 can generate radio frequency signals from the network analyzer 440 and emit the same via the radiating antenna 416 toward the radio frequency apertures. The radiating antenna 416 and the network analyzer 440 can detect and analyze radio frequency signals reflected back to the radiating antenna 416 to determine whether the radio frequency apertures are operable based on a suitable predetermined testing criteria.

With reference to FIGS. 1-8, a method for integrated testing and manufacturing radio frequency apertures is now set forth. While other steps and testing may be needed to produce finished radio frequency apertures, or products incorporating radio frequency apertures, the method set forth below comprises integrated steps that can advantageously be completed at a single workstation.

First, a printed wire board having one or more traces can be provided at workstation 110. For example, the printed wire board can rest on or otherwise be supported by the work surface 116. The printed wire board can include a plurality of traces that are defined functional components of completed radio frequency apertures. A contact probe 210 (operably connected to a computer or other electronics testing component) can be attached to a fixture receiver 118 at a distal end of the robotic arm 112 via the fixture mount 212. With the contact probe 210 attached to the robotic arm 112, the robotic arm 112 can manipulate the contact probe 210 to touch down on the traces of the printed wire board to determine whether each trace is functional.

Once the contact probing is completed with the contact probe 210, the method can further comprise removing the contact probe 210 from the fixture receiver 118 of the robotic arm 112. The printed wire board can then be joined to other components to form the radio frequency apertures. Accordingly, the soldering device 310 can be attached to the fixture receiver 118 of the robotic arm 112 via the fixture mount 312. With the soldering device 310 attached to the robotic arm 112, the robotic arm 112 can manipulate the soldering device 310 into the needed positions and the soldering device 310 operated to solder the other components to the printed wire board to form the radio frequency apertures.

With the soldering operation complete and after the radio frequency apertures are manufactured, the method can further comprise contactless testing of the radio frequency apertures. The soldering device 310 can be removed from the fixture receiver 118 of the robotic arm 112. The contactless probe 430 can then be attached to the fixture receiver 118 of the robotic arm. The robotic arm 112 can then manipulate the contactless probe 430 to determine whether each of the radio frequency apertures is functional.

The above described system and method allows for efficient integrated testing and manufacturing of radio frequency apertures. Further the contactless probe allows for contactless testing to be done in three-dimensions using, for example a six-axis robot while reducing radio frequency signal loss due to the contactless probe supporting the network analyzer, radio frequency antenna, and cables in a single, compact fixture.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The use of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A system for contactless testing of radio frequency apertures, the system comprising:
    a fixture comprising a fixture mount configured to be received in a fixture receiver of a robotic system;
    a network analyzer supported by the fixture; and
    a radiating antenna supported by the fixture, the radiating antenna connected to the network analyzer via at least one cable;
    wherein, upon movement of the fixture via the robotic system, the network analyzer, the radiating antenna, and the at least one cable maintain a static positional relationship relative to one another.

2. The system of claim 1, wherein:
    the fixture further comprises a housing; and
    the fixture mount is disposed on a top side of the housing.

3. The system of claim 2, wherein the network analyzer is disposed at least partially within the housing.

4. The system of claim 3, wherein:
    the housing has an open side; and
    the at least one cable is connected to the network analyzer at the open side.

5. The system of claim 2, wherein the radiating antenna is disposed on a lower side of the housing.

6. The system of claim 1, wherein the radiating antenna comprises a horn antenna.

7. A system for integrated manufacturing and testing of radio frequency apertures, the system comprising:
    a robotic arm comprising a fixture receiver supported at a distal end of the robotic arm;
    a contact probe comprising a first fixture mount configured to be received by the fixture receiver of the robotic arm, the contact probe configured to contact test traces of one or more printed wire boards;
    a soldering tip comprising a second fixture mount configured to be received by the fixture receiver of the robotic arm, the soldering tip configured to join the printed wire boards and other components of the radio frequency apertures; and
    a contactless probe comprising:
        a fixture comprising a third fixture mount configured to be received by the fixture receiver of the robotic arm;
        a network analyzer supported by the fixture; and
        a radiating antenna supported by the fixture, the radiating antenna connected to the network analyzer via at least one cable;
    wherein, upon movement of the fixture via the robotic arm, the network analyzer, the radiating antenna, and the at least one cable maintain a static positional relationship relative to one another; and
    wherein the contactless probe being operable is configured to validate functionality of the radio frequency apertures.

8. The system of claim 7, wherein the robotic arm comprises a six-axis robotic arm.

9. The system of claim 7, wherein the contactless probe further comprises a housing supporting the third fixture mount, the network analyzer, and the radiating antenna.

10. The system of claim 9, wherein the housing comprises a top frame, a bottom frame, and side frames connecting the top frame to the bottom frame to define an internal compartment.

11. The system of claim 10, wherein the network analyzer is disposed at least partially within the internal compartment.

12. The system of claim 10, wherein:
the third fixture mount is disposed on the top frame; and
the radiating antenna is supported by the bottom frame.

13. The system of claim 10, wherein:
the housing comprises an open side; and
the network analyzer comprises one or more cable connection points that are disposed at the open side.

14. The system of claim 7, wherein the radiating antenna comprises a horn antenna.

15. The system of claim 7, wherein the fixture receiver comprises a quick connect type mount.

16. A method for integrated testing and manufacturing of radio frequency apertures, the method comprising:
operating a contact probe with a robotic arm to evaluate functionality of traces on a printed wire board;
operating a soldering tip with the robotic arm to solder the printed wire board to one or more other components to form a radio frequency apertures assembly; and
operating a contactless probe with the robotic arm to evaluate functionality of the radio frequency apertures using the contactless probe;
wherein the contactless probe comprises:
a fixture comprising a fixture mount configured to be received in a fixture receiver of the robotic arm;
a network analyzer supported by the fixture; and
a radiating antenna supported by the fixture, the radiating antenna connected to the network analyzer via at least one cable; and
wherein, upon movement of the fixture via the robotic arm, the network analyzer, the radiating antenna, and the at least one cable maintain a static positional relationship relative to one another.

17. The method of claim 16, wherein operating the contactless probe comprises moving a the network analyzer and the radiating antenna supported by a housing attached to the robotic arm.

18. The method of claim 17, wherein the network analyzer is disposed at least partially within the housing.

19. The method of claim 16, further comprising:
removing the contact probe from the robotic arm after operating the contact probe and attaching the soldering tip to the robotic arm.

20. The method of claim 19, further comprising:
removing the soldering tip from the robotic arm after operating the soldering tip and attaching the contactless probe to the robotic arm.

* * * * *